United States Patent
Ahmad et al.

(10) Patent No.: US 9,911,062 B1
(45) Date of Patent: Mar. 6, 2018

(54) BACKGROUND PHASE CORRECTION FOR QUANTITATIVE CARDIOVASCULAR MRI

(71) Applicant: Ohio State Innovation Foundation, Columbus, OH (US)

(72) Inventors: Rizwan Ahmad, Hilliard, OH (US); Ning Jin, Powell, OH (US); Orlando P. Simonetti, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 153 days.

(21) Appl. No.: 14/918,184

(22) Filed: Oct. 20, 2015

(51) Int. Cl.
| | | |
|---|---|---|
| G06K 9/00 | (2006.01) | |
| G06K 9/52 | (2006.01) | |
| G01R 33/565 | (2006.01) | |
| G06T 7/00 | (2017.01) | |
| G06T 5/00 | (2006.01) | |
| G06T 11/00 | (2006.01) | |

(52) U.S. Cl.
CPC ......... G06K 9/52 (2013.01); G01R 33/56518 (2013.01); G06T 5/00 (2013.01); G06T 7/0012 (2013.01); G06T 7/0042 (2013.01); G06T 11/005 (2013.01); *G06T 2207/10088* (2013.01); *G06T 2207/20172* (2013.01)

(58) Field of Classification Search
None
See application file for complete search history.

(56) References Cited

U.S. PATENT DOCUMENTS

| | | | | |
|---|---|---|---|---|
| 5,378,985 A | * | 1/1995 | Hinks | G01R 33/56554 324/307 |
| 5,770,943 A | * | 6/1998 | Zhou | G01R 33/56518 324/307 |
| 7,292,032 B1 | * | 11/2007 | Polzin | G01R 33/56308 324/306 |
| 9,678,187 B2 | * | 6/2017 | Shirai | G01R 33/4625 |

(Continued)

OTHER PUBLICATIONS

Bernstein, M. A., Zhou, X. J., Polzin, J. A., King, K. F., Ganin, A., Pelc, N. J., & Glover, G. H. (1998). Concomitant gradient terms in phase contrast MR: analysis and correction. Magnetic resonance in medicine, 39(2), 300-308.*

(Continued)

*Primary Examiner* — Vu Le
*Assistant Examiner* — Samah Beg
(74) *Attorney, Agent, or Firm* — Meunier Carlin & Curfman LLC (57) ABSTRACT

Systems and methods of correcting eddy current-induced background phase (EC-BP) in magnetic resonance imaging (PC-MRI) data. The method includes acquiring a slice of interest (SOI) at a first table position using a magnetic resonance imaging (MRI) scanner, the slice of interest having a predetermined imaging orientation and being acquired having predetermined gradient waveforms; acquiring at least one additional slice at a second table position using the MRI scanner, the at least one additional slice having a same imaging orientation as the slice of interest and being acquired using the same gradient waveforms as the slice of interest; determining time-averaged phase maps (Continued)

from the slice of interest and the at least one additional slice; determining a correction map from the time-averaged phase maps; and correcting a background phase (BP) of the slice of interest using the correction map.

19 Claims, 3 Drawing Sheets

(56) References Cited

U.S. PATENT DOCUMENTS

| | | | |
|---|---|---|---|
| 2006/0022674 A1* | 2/2006 | Zhou | G01R 33/56518 324/309 |
| 2008/0107316 A1* | 5/2008 | Zhao | G01R 33/56308 382/130 |
| 2009/0256568 A1* | 10/2009 | Wiesinger | G01R 33/243 324/312 |
| 2010/0272337 A1* | 10/2010 | Shirai | G01R 33/485 382/131 |
| 2011/0112393 A1* | 5/2011 | Taniguchi | A61B 5/055 600/410 |
| 2012/0098535 A1* | 4/2012 | Kaneta | G01R 33/56518 324/307 |
| 2013/0002247 A1* | 1/2013 | Haacke | G01R 33/56545 324/307 |
| 2014/0112564 A1* | 4/2014 | Hsiao | G01R 33/5608 382/131 |
| 2014/0306703 A1* | 10/2014 | Shirai | G01R 33/56518 324/309 |
| 2014/0316250 A1* | 10/2014 | Ahmad | A61B 5/0263 600/416 |
| 2015/0212177 A1* | 7/2015 | Ahmad | G01R 33/4818 324/309 |
| 2016/0232690 A1* | 8/2016 | Ahmad | G06T 11/005 |
| 2016/0341810 A1* | 11/2016 | Rich | G01R 33/5608 |

OTHER PUBLICATIONS

Bock, J., Kreher, B. W., Hennig, J., & Markl, M. (May 2007). Optimized pre-processing of time-resolved 2D and 3D phase contrast MRI data. In Proceedings of the 15th Scientific Meeting. International Society for Magnetic Resonance in Medicine, Berlin, Germany (p. 3138).*
Markl, M., Bammer, R., Alley, M. T., Elkins, C. J., Draney, M. T., Barnett, A., . . . & Pelc, N. J. (2003). Generalized reconstruction of phase contrast MRI: analysis and correction of the effect of gradient field distortions. Magnetic resonance in medicine, 50(4), 791-801.*
Lorenz, R., Bock, J., Snyder, J., Korvink, J. G., Jung, B. A., & Markl, M. (2014). Influence of eddy current, Maxwell and gradient field corrections on 3D flow visualization of 3D CINE PC-MRI data. Magnetic resonance in medicine, 72(1), 33-40.*
Lankhaar, J. W., Hofman, M., Marcus, J. T., Zwanenburg, J. J., Faes, T. J., & Vonk-Noordegraaf, A. (2005). Correction of phase offset errors in main pulmonary artery flow quantification. Journal of Magnetic Resonance Imaging, 22(1), 73-79.*
Walker, P. G., Cranney, G. B., Scheidegger, M. B., Waseleski, G., Pohost, G. M., & Yoganathan, A. P. (1993). Semiautomated method for noise reduction and background phase error correction in MR phase velocity data. Journal of Magnetic Resonance Imaging, 3(3), 521-530.*
Arenillas, J. F. et al. Progression and clinical recurrence of symptomatic middle cerebral artery stenosis: a long-term follow-up transcranial Doppler ultrasound study. Stroke. 32, 2898-2904 (2001).
Aurigemma, G. et al. Abnormal left ventricular intracavitary flow acceleration in patients undergoing aortic valve replacement for aortic stenosis. A marker for high postoperative morbidity and mortality. Circulation 86, 926-936 (1992).
Beck, A. & Teboulle, M. A Fast Iterative Shrinkage-Thresholding Algorithm for Linear Inverse Problems. Siam J. Imaging Sci. 2, 183-202 (2009).

Bernstein, M. A., Grgic, M., Brosnan, T. J. & Pelc, N. J. Reconstructions of phase contrast, phased array multicoil data. Magn. Reson. Med. 32, 330-334 (1994).
Bernstein, M. A. et al. Concomitant gradient terms in phase contrast MR: Analysis and correction. Magn. Reson. Med. 39, 300-308 (1998).
Breuer, F. A., Kellman, P., Griswold, M. A. & Jakob, P. M. Dynamic autocalibrated parallel imaging using temporal GRAPPA (TGRAPPA). Magn. Reson. Med. 53, 981-985 (2005).
Chen, W., Guo, Y., Wu, Z. & Nayak, K. MRI Constrained Reconstruction Without Tuning Parameters Using ADMM and Morozov's Discrepancy Principle. in ISMRM 23rd Annu. Meet. Exhib. 3410 (2015).
Chernobelsky, A., Shubayev, O., Comeau, C. R. & Wolff, S. D. Baseline correction of phase contrast images improves quantification of blood flow in the great vessels. J. Cardiovasc. Magn. Reson. 9, 681-685 (2007).
Clark, D. M., Plumb, V. J., Epstein, A. E. & Kay, G. N. Hemodynamic effects of an irregular sequence of ventricular cycle lengths during atrial fibrillation. J. Am. Coll. Cardiol. 30, 1039-1045 (1997).
Dunn, O. J. Multiple Comparisons Using Rank Sums. Technometrics 6, pp. 241-252 (1964).
Dyverfeldt, P., Hope, M. D., Tseng, E. E. & Saloner, D. Magnetic resonance measurement of turbulent kinetic energy for the estimation of irreversible pressure loss in aortic stenosis. JACC Cardiovasc. Imaging 6, 64-71 (2013).
Ebbers, T. et al. Higher order weighted least-squares phase offset correction for improved accuracy in phase-contrast MRI. in ISMRM 16th Annu. Meet. Exhib. 1367 (2008).
Eriksson, J. et al. Semi-automatic quantification of 4D left ventricular blood flow. J. Cardiovasc. Magn. Reson. 12, 9 (2010).
Fair, M., Gatehouse, P. D., Greiser, A., Drivas, P. & Firmin, D. N. A novel approach to phase-contrast velocity offset correction by in vivo high-SNR acquisitions. J. Cardiovasc. Magn. Reson. 15, p. 56 (2013).
Fluckiger, J. U. et al. Left atrial flow velocity distribution and flow coherence using four-dimensional FLOW MRI: A pilot study investigating the impact of age and Pre- and Postintervention atrial fibrillation on atrial hemodynamics. J. Magn. Reson. Imaging 38, 580-587 (2013).
François, C. J. et al. Renal arteries: isotropic, high-spatial-resolution, unenhanced MR angiography with three-dimensional radial phase contrast. Radiology 258, 254-260 (2011).
Frydrychowicz, A. et al. Three-dimensional analysis of segmental wall shear stress in the aorta by flow-sensitive four-dimensional-MRI. J. Magn. Reson. Imaging 30, 77-84 (2009).
Galderisi, M. et al. Recommendations of the European Association of Echocardiography How to use echo-Doppler in clinical trials: Different modalities for different purposes. Eur. J. Echocardiogr. 12, 339-353 (2011).
Gatehouse, P. D. et al. Applications of phase-contrast flow and velocity imaging in cardiovascular MRI. Eur. Radiol. 15, 2172-2184 (2005).
Gatehouse, P. D. et al. Flow measurement by cardiovascular magnetic resonance: a multi-centre multi-vendor study of background phase offset errors that can compromise the accuracy of derived regurgitant or shunt flow measurements. J. Cardiovasc. Magn. Reson. 12, 5 (2010).
Gatehouse, P. D. et al. A multi-center inter-manufacturer study of the temporal stability of phase-contrast velocity mapping background offset errors. J. Cardiovasc. Magn. Reson. 14, 72 (2012).
Griswold, M. A. et al. Generalized autocalibrating partially parallel acquisitions (GRAPPA). Magn. Reson. Med. 47, 1202-1210 (2002).
Hansen, P. C. & O'Leary, D. P. The Use of the L-Curve in the Regularization of Discrete Ill-Posed Problems. SIAM J. Sci. Comput. 14, 1487-1503 (1993).
Harloff, A. et al. In vivo assessment of wall shear stress in the atherosclerotic aorta using flow-sensitive 4D MRI. Magn. Reson. Med. 63, 1529-1536 (2010).
Holland, B. J., Printz, B. F. & Lai, W. W. Baseline correction of phase-contrast images in congenital cardiovascular magnetic resonance. J. Cardiovasc. Magn. Reson. 12, 11 (2010).

(56) References Cited

OTHER PUBLICATIONS

Hope, T. A. et al. Comparison of flow patterns in ascending aortic aneurysms and volunteers using four-dimensional magnetic resonance velocity mapping. J. Magn. Reson. Imaging 26, 1471-1479 (2007).
Hope, T. A. et al. Evaluation of intracranial stenoses and aneurysms with accelerated 4D flow. Magn. Reson. Imaging 28, 41-46 (2010).
Hsiao, A. et al. Rapid pediatric cardiac assessment of flow and ventricular volume with compressed sensing parallel imaging volumetric cine phase-contrast MRI. Am. J. Roentgenol. 198, (2012).
Kilner, P. J., Gatehouse, P. D. & Firmin, D. N. Flow measurement by magnetic resonance: a unique asset worth optimising. J. Cardiovasc. Magn. Reson. 9, 723-728 (2007).
Lankhaar, J. W. et al. Correction of phase offset errors in main pulmonary artery flow quantification. J. Magn. Reson. Imaging 22, 73-79 (2005).
Lorenz, R. et al. Influence of eddy current, Maxwell and gradient field corrections on 3D flow visualization of 3D CINE PC-MRI data. Magn. Reson. Med. 72, 33-40 (2014).
Lustig, M., Donoho, D. L., Santos, J. M. & Pauly, J. M. Compressed Sensing MRI. IEEE Signal Process. Mag. 25, 72-82 (2008).
Markl, M. et al. Generalized reconstruction of phase contrast MRI: Analysis and correction of the effect of gradient field distortions. Magn. Reson. Med. 50, 791-801 (2003).
Markl, M. et al. Estimation of global aortic pulse wave velocity by flow-sensitive 4D MRI. Magn. Reson. Med. 63, 1575-1582 (2010).
Mitchell, L., Jenkins, J. P., Watson, Y., Rowlands, D. J. & Isherwood, I. Diagnosis and assessment of mitral and aortic valve disease by cine-flow magnetic resonance imaging. Magn. Reson. Med. 12, 181-197 (1989).
Moore, J. E., Xu, C., Glagov, S., Zarins, C. K. & Ku, D. N. Fluid wall shear stress measurements in a model of the human abdominal aorta: Oscillatory behavior and relationship to atherosclerosis. Atherosclerosis 110, 225-240 (1994).
Moran, P. R. A flow velocity zeugmatographic interlace for NMR imaging in humans. Magn. Reson. Imaging 1, 197-203 (1982).
Nordmeyer, S. et al. Four-dimensional velocity-encoded magnetic resonance imaging improves blood flow quantification in patients with complex accelerated flow. J. Magn. Reson. Imaging 37, 208-216 (2013).
Noureldin, R. A. et al. The diagnosis of hypertrophic cardiomyopathy by cardiovascular magnetic resonance. J. Cardiovasc. Magn. Reson. 14, 17 (2012).
Pelc, N. J., Herfkens, R. J., Shimakawa, A. & Enzmann, D. R. Phase contrast cine magnetic resonance imaging. Magn. Reson. Q. 7, 229-254 (1991).
Powell, A. J. & Geva, T. Blood flow measurement by magnetic resonance imaging in congenital heart disease. Pediatr. Cardiol. 21, 47-58 (2000).
Pruessmann, K. P., Weiger, M., Scheidegger, M. B. & Boesiger, P. SENSE: Sensitivity encoding for fast MRI. Magn. Reson. Med. 42, 952-962 (1999).
Reeder, G. S., Currie, P. J., Hagler, D. J., Tajik, A. J. & Seward, J. B. Use of Doppler Techniques (Continuous-Wave, Pulsed-Wave, and Color Flow Imaging) in the Noninvasive Hemodynamic Assessment of Congenital Heart Disease. Mayo Clin. Proc. 61, 725-744 (1986).
Schubert, T., Bieri, O., Pansini, M., Stippich, C. & Santini, F. Peak velocity measurements in tortuous arteries with phase contrast magnetic resonance imaging: the effect of multidirectional velocity encoding. Invest. Radiol. 49, 189-194 (2014).
Stankovic, Z. et al. Normal and Altered Three-dimensional Portal Venous Hemodynamics in Patients with Liver Cirrhosis. Radiology 262, 862-873 (2012).
Strandness, D. E., Schultz, R. D., Sumner, D. S. & Rushmer, R. F. Ultrasonic flow detection. Am. J. Surg. 113, 311-320 (1967).
Tan, E. T., Brau, A. C. & Hardy, C. J. Nonlinear self-calibrated phase-contrast correction in quantitative cardiac imaging. J. Cardiovasc. Magn. Reson. 16, p. 349 (2014).
Taylor, T. W. & Yamaguchi, T. Three-dimensional simulation of blood flow in an abdominal aortic aneurysm—steady and unsteady flow cases. J. Biomech. Eng. 116, 89-97 (1994).
Tyszka, J. M., Laidlaw, D. H., Asa, J. W. & Silverman, J. M. Three-dimensional, time-resolved (4D) relative pressure mapping using magnetic resonance imaging. J. Magn. Reson. Imaging 12, 321-329 (2000).
Weiss, M. B. et al. Myocardial blood flow in congestive and hypertrophic cardiomyopathy: relationship to peak wall stress and mean velocity of circumferential fiber shortening. Circulation 54, 484-494 (1976).

\* cited by examiner

BACKGROUND PHASE CORRECTION FOR QUANTITATIVE CARDIOVASCULAR MRI

BACKGROUND

Alterations in hemodynamics have been linked to wide-ranging cardiac and vascular conditions, including cardiomyopathy, atrial fibrillation, valvular abnormalities, aortic atherosclerosis and aneurysm, congenital heart disease, renal stenosis, portal hypertension due to liver cirrhosis, intracranial aneurysm and stenosis, and peripheral arterial disease. Among the clinical tools available to investigate blood velocity, Doppler ultrasound is a popular choice. However, in many patients (e.g., those suffering from obesity or chronic lung disease) the results are sub-optimal due to poor acoustic windows or misalignment between the ultrasound beam and the blood flow. Also, in the case of valvular stenosis, heavy calcification of the aortic valve or significant flow acceleration in the left ventricular outflow tract may obscure assessment of the aortic valve.

Phase-contrast MRI (PC-MRI) is not limited by the acoustic windows of ultrasound, and can be used in combination with other MRI techniques for a comprehensive evaluation of patients with known or suspected cardiovascular disease. PC-MRI enables quantification of several hemodynamic parameters, including flow volume and peak velocity, and is used routinely to assess patients with congenital heart disease and valvular abnormalities. When extended to three spatial dimensions and three directions of velocity (4D flow), more sophisticated parameters such as wall shear stress, pulse wave velocity, turbulence intensity, and 3D pressure gradients can also be extracted to provide a comprehensive characterization of the cardiovascular system that is not available otherwise.

Flow information in PC-MRI is encoded into the phase of the complex-valued image. This information is then retrieved by measuring the pixel-wise phase difference between images collected under different values of the velocity-encoding (VENC) gradients. Inadvertently, PC-MRI measurements also encode phase due to gradient waveform distortions, which cannot be removed by pixel-wise phase subtraction, resulting in a residual background phase (BP). Studies have shown that BP can introduce significant errors in the quantification of flow volume, which involves spatial and temporal integration of the blood velocity and thus accumulates BP errors over space and time. BP due to concomitant gradients can be corrected with reasonable accuracy; however, accounting for eddy currents-induced BP (EC-BP) has not been satisfactorily addressed. As the clinical utility of cardiac MRI expands, it is important that clinicians trust the flow volume measurements, which cannot be achieved without addressing the issue of EC-BP.

One method that has been proposed to correct for EC-BP is to perform a separate experiment using a static phantom. In this method, the phantom measurements are performed after removing the patient from the scanner and by repeating the same pulse sequence that was used for in vivo measurements. The BP obtained from the static phantom is subtracted directly from the in vivo phase map. For multi-directional encoding, the process of subtraction is repeated for all encoding directions. This method, despite being robust, is not an attractive option because of the significant extra time required to perform phantom imaging for each clinical sequence performed. Another widely reported method to correct BP relies on fitting and subtracting a polynomial surface to the pixels within regions of static tissue. To employ higher order polynomials, which have been shown to improve the accuracy of BP correction, this method requires sufficient static tissue in close proximity to the region of interest—a requirement that cannot be met for imaging of the heart or great vessels in the thorax that are generally surrounded by air (which is devoid of MRI signal) in the lungs.

Figure 1:
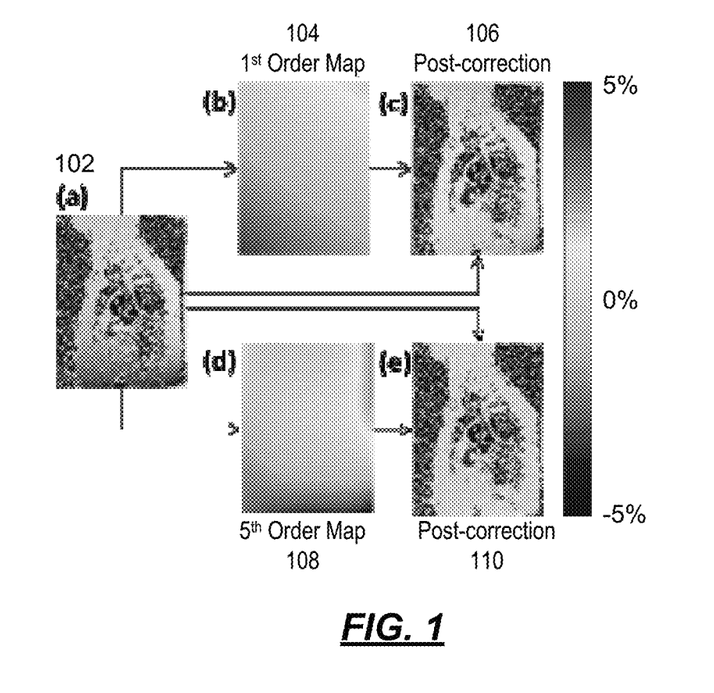
FIG. 1 illustrates a time-averaged phase map after applying correction for concomitant gradients.

The challenges associated with this method are depicted in FIG. 1, which illustrates a time-averaged phase map 102 after applying correction for concomitant gradients, BP correction maps obtained by least squares fitting with 1st and 5th order polynomials (104 and 108, respectively), and the corrected phase maps after applying the 1st order and 5th order corrections (106 and 110, respectively). As shown in FIG. 1, the display range is ±5% of the VENC. In FIG. 1, the results are shown for a routine PC-MRI acquisition performed on a juvenile subject using a clinical scanner (1.5T MAGNETOM Aera, Siemens Healthcare, Erlangen, Germany). As shown in FIG. 1, least squares fitting on pixels within static tissue gives widely different results when polynomials of $1^{st}$ and $5^{th}$ orders are used. A pixel was regarded as static if its temporal standard deviation was in the bottom quartile. The phase difference between the two corrections around the heart region is 0.8% of the VENC, which implies that flow volume quantification cannot be simultaneously accurate for both corrections.

On one hand, the $1^{st}$ order polynomial fitting exhibits signs of under-fitting as evidenced by the residual background phase in the corrected map (104). On the other hand, the $5^{th}$ order polynomial fitting may very well result in an over-fitting, especially in regions away from the static tissue. The example of FIG. 1 highlights the instability associated with polynomial fitting when the static tissue is distal to the area of interest. This example also highlights the problem of selecting an appropriate polynomial order. Higher order polynomials have been shown to improve accuracy, but in the absence of adequate data (pixels from static tissue) higher order polynomial fitting can generate erroneous results. Similar results were observed when weighted least squares was employed instead of explicit classification of pixels into static and non-static regions. Thus, current methods fall short of fully addressing the BP correction issue that affects every PC-MRI acquisition.

SUMMARY

Disclosed herein is an EC-BP correction scheme called multi-slice acquisition and processing (mSAP) where additional slices from the subject's own body are used in lieu of a static phantom. In mSAP, in addition to the slice of interest, data are also collected from at least one extra slice in the same imaging orientation using the same gradient waveforms but with different table position. As such, all slices collected under these conditions will have the same background phase; therefore, by leveraging information from additional slices with abundant static tissue, mSAP circumvents the uncertainties associated with available methods that utilize data from a single slice.

In some implementations, multi-slice data processing and generalized least-squares with $l_1$ penalty provide a more accurate, robust, and practical solution to this problem than possible with existing methods. By streamlining the acquisition protocol to minimize the overhead associated with the acquisition of additional helper slices, mSAP can be a practical and robust solution to the inaccuracy in PC-MRI volume flow measurement caused by BP.

In an example implementation, PC-MRI to evaluate hemodynamics in pediatric patients with congenital heart disease is an application that can specifically benefit from mSAP. Since imaging in pediatric patients is often performed under free-breathing conditions, the resulting phase from the respiratory motion in conjunction with limited availability of static tissue due to small habitus makes polynomial fitting challenging using the slice of interest (SOI) itself. In a recent study involving PC-MRI of pediatric patients, Hsiao et al. argued that residual EC-BP may be to blame for the apparent discrepancy in their results. In accordance with aspects of the present disclosure, by collecting "helper" slices (HS) from an area, e.g., shoulder or pelvic regions, which are not significantly impacted by cardiac or respiratory motion and have an abundance of static tissue, mSAP can be effectively applied to combat EC-BP in free-breathing acquisitions.

Thus, in accordance with the above, a method of correcting eddy current-induced background phase (EC-BP) in magnetic resonance imaging (PC-MRI) data is disclosed herein. The method includes acquiring a slice of interest (SOI) at a first table position using a magnetic resonance imaging (MRI) scanner, the slice of interest having a predetermined imaging orientation and being acquired having predetermined gradient waveforms; acquiring at least one additional slice at a second table position using the MRI scanner, the at least one additional slice having a same imaging orientation as the slice of interest and being acquired using the same gradient waveforms as the slice of interest; determining phase maps from the slice of interest and the at least one additional slice; determining a correction map from the time-averaged phase maps; and correcting a background phase (BP) of the slice of interest using the correction map, which is estimated by processing all acquired slices. In some implementations, phase maps may be time averaged. In some implementations, background phase may be estimated and corrected in each temporal frame individually.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. While implementations will be described for remotely accessing applications, it will become evident to those skilled in the art that the implementations are not limited thereto, but are applicable for remotely accessing any type of data or service via a remote device.

INTRODUCTION

Disclosed herein is an EC-BP correction scheme called multi-slice acquisition and processing (mSAP) where additional slices from the subject's own body are used in lieu of a static phantom. In mSAP, in addition to the slice of interest (SOI), data is also collected from at least one extra slice in the same imaging orientation using the same gradient waveforms but with different table position. As such, all slices collected under these conditions should have the same background phase; therefore, by leveraging information from additional slices with abundant static tissue, mSAP circumvents the uncertainties associated with available methods that utilize data from a single slice.

Figure 2:
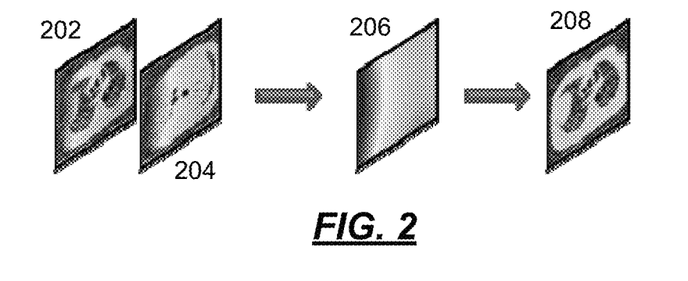
FIG. 2 illustrates time-averaged phase maps from the slice of interest (SOI) and at least one "helper" slice (HS) that are jointly processed to create a correction map that is used to correct the background phase in SOI.

The robustness of the disclosed method is strengthened by imposing $l_1$ regularization to polynomial regression, effectively eliminating the need to precisely prescribe the polynomial order in advance. FIG. 2 illustrates a high level overview of mSAP, which shows time-averaged phase maps from the slice of interest (SOI) 202 and one "helper" slice (HS) 204 that are jointly processed to create a correction map 206. The correction map 206 is used to correct the background phase in SOI, as shown by reference number 208. By using just one additional slice (i.e., the helper slice 204), e.g., from the abdominal or pelvic area, mSAP reduces the BP errors to below 0.4% of the dynamic range, which will lead to less than 5% miscalculation of cardiac output and less than 10% error in shunt measurement. In the present disclosure, the development of mSAP may be organized as follows.

The method of the present disclosure provides a novel solution to EC-BP where information from additional anatomical slices is leveraged to perform accurate and robust correction of BP in the slice of interest. For cardiac PC-MRI, there is a lack of static tissue around the heart and great vessels; therefore, fitting performed on the SOI alone is prone to errors. If selected appropriately, HS can provide complementary information that is missing from the SOI. When processed jointly, SOI and HS can yield more accurate results than possible by fitting the SOI alone.

The conventional method to correct for EC-BP is to divide the image into static and dynamic regions and perform polynomial fitting on the pixels in the static regions. The fitted polynomial surface is then subtracted from the phase map. The performance of this approach relies on user selected thresholds on magnitude and temporal variation of phase to segment the image. In contrast, the method(s) of the present disclosure use a generalized least squares method that employs the covariance matrix (or its approximation) to "de-correlate" and normalize the errors across the pixels. This approach not only deemphasizes regions where phase has high temporal variance but also take into account the independence of information, without using any tuning parameters.

The polynomial fitting methods are sensitive to not only the extent of the static tissue in the close vicinity of the vessel but also to the selection of the polynomial order. Although data from multiple slices adds robustness to higher order fitting, one is still left with the important decision of selecting the polynomial order. For mSAP, a high order polynomial fitting is used with Lasso regression which enforces an $l_1$-norm penalty on the polynomial coefficients. This constraint prompts unnecessary coefficients to be zero and thus effectively reduces the number of variables upon which the fitting is dependent. Although the $l_1$-norm penalty has been extensively applied for compressive recovery of MRI from undersampled data, this has not been used as a safeguard against over-fitting for BP correction.

The techniques herein correct for EC-BP by jointly processing data from anatomically different slices collected at the same position relative to isocenter using identical gradient waveforms. The BP-induced errors are reduced to less than 0.4%, resulting in an error of less than 5% in flow volume.

Methodology Development

The following presents the algorithmic details of mSAP for EC-BP correction.

Joint Processing of Multi-Slice Data

In PC-MRI, velocity information is encoded into the phase of the complex-valued image. To cancel the contributions from other sources, e.g., due to sensitivity maps of receive coils or $B_0$ inhomogeneity, k-space at each cardiac phase is sampled twice, with two different values of VENC. Typically, the first step is to reconstruct complex image series—one for each velocity encoding—from the multi-channel k-space data using parallel imaging methods, e.g., SENSE or GRAPPA. A phase subtraction between the two differently encoded image series followed by scaling with VENC generates a spatiotemporal velocity map.

Using the knowledge of the gradient waveforms and deviation from linear behavior, corrections can be applied to remove for the effects of concomitant gradients and gradient non-linearity. Since the velocity encoding gradient varies between the two encodings, the eddy currents generated by those two waveforms are different and thus do not completely cancel upon phase subtraction. Therefore, even after applying the correction for concomitant gradients, the velocity map is still contaminated with EC-BP. The EC-BP distribution has complicated dependence on gradient waveforms and is difficult to estimate even when the gradient waveforms are known precisely. In addition, because the EC-BP may not have long-term reproducibility, precomputing correction maps for EC-BP would be ineffective.

The most commonly employed method for EC-BP is based on the polynomial fitting of the phase map, which can be written as:

$$\hat{x} = \operatorname*{argmin}_{x} \|PAx - Py\|_2^2, \quad\quad 1)$$

where vector $x \in \mathbb{R}^{k \times 1}$ represents the k coefficients of a 2D polynomial, each column of matrix $A \in \mathbb{R}^{M \times k}$ defines the spatial distribution of one of the polynomial terms, vector $y \in \mathbb{R}^{M \times 1}$ is the measured temporally-averaged phase map, and P is a row-pruning operator ($P \in \mathbb{R}^{N \times M}$ with N<M) based on user defined thresholds on the temporal variance of phase map and the magnitude of the complex image for which y is the phase. Alternatively, P is a diagonal weighting operator ($P \in \mathbb{R}^{M \times M}$) that deemphasizes pixels with high temporal variance. The resulting correction map, $\hat{\phi}$, is then obtained by $\hat{\phi} = A\hat{x}$.

For multi-slice processing, x is estimated based on jointly fitting data from N slices, as follows:

$$\hat{x} = \operatorname*{argmin}_{x} \|Bx - z\|_\Omega^2, \quad\quad 2)$$

where B and z are obtained by vertical concatenation of N temporally-averaged slices, i.e., $B \triangleq [A_1^T | A_2^T | \ldots | A_N^T]T$ and $z \triangleq [y_1^T | y_2^T | \ldots | y_N^T]T$, and $\|Bx-z\|_\Omega^2 \triangleq (Bx-z)'\Omega^{-1}(Bx-z)$. The covariance matrix, $\Omega \in \mathbb{R}^{NM \times NM}$, is constructed by computing inner products of mean-subtracted temporal profiles across all pixel pairs in z. By using Cholesky decomposition, $\Omega = LL'$, $\tilde{B} \triangleq L^{-1}B$, $\tilde{z} \triangleq L^{-1}z$, and by enforcing $l_1$-norm penalty on polynomial coefficients, Eq. 2 becomes:

$$\hat{x}_{mSAP} = \operatorname*{argmin}_{x} \|\tilde{B}x - \tilde{z}\|_2^2 + \lambda\|x\|_1 \quad\quad 3)$$

Eq. 3 may be solved using Fast Iterative Shrinkage-Thresholding Algorithm (FISTA), and the value of $\lambda$ using Morozov discrepancy principle. The resulting correction map, $\hat{\phi}_{mSAP}$, is then obtained by $\hat{\phi}_{mSAP} = A_i\hat{x}_{mSAP}$, where $A_i$ corresponds to the SOI.

The processing described above, enables performance of mSAP on multi-slice PC-MRI data using, e.g., Matlab (MathWorks, Natick, Mass.). mSAP will provide tuning-free correction of EC-BP.

In the above, the Cholesky decomposition for large $\Omega$ can be computationally expensive. Should that be the case, $\Omega$ can be alternatively constructed in a sparse format by setting the entries with small values equal to zero. This sparse approximation of $\Omega$ would facilitate faster Cholesky decomposition. Also, rows from B and z that belong to the region with nearly zero spin-density can be removed. The elimination of these entries will further speed up the processing without having significant impact on $\hat{x}_{mSAP}$.

Morozov discrepancy principle for selecting $\lambda$ is based on the assumption that variance of each element of $\tilde{B}x-\tilde{z}$ is one. In the case of model mismatch, this assumption may not be valid. Should that be the case, L-curve criterion may be used to determine $\lambda$. Due the small size of the problem in Eq. 3, employing L-curve criterion is a viable alternative.

Figure 3:
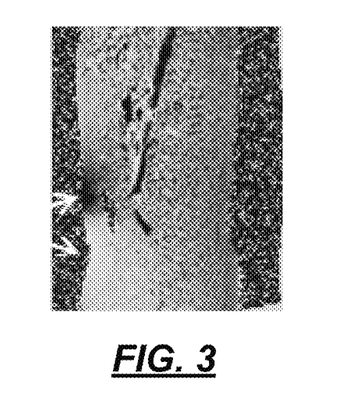
FIG. 3 illustrates an example in vivo time-averaged phase map.

It is not uncommon to encounter outliers in the phase map, especially at the tissue air boundary. FIG. 3 shows an example in vivo time-averaged phase map collected on 1.5T Siemens Avanto scanner. Outliers (white arrows) at tissue boundaries are visible. These outliers do not necessarily have large temporal standard deviations; therefore, they can be difficult to eliminate without manual intervention. Should that be the case, an outlier rejection scheme may be implemented where a pixel i is classified as an outlier if the modified z-score of the corresponding residual, $[\tilde{B}x-\tilde{z}]_i$, is more than, e.g., 3.5. After identifying and excluding the outliers, the fitting process will be repeated using Eq. 3.

Implementation of Acquisition Protocol

To facilitate routine use, mSAP may be implemented on a clinical scanner. The implementation includes updating the existing protocol for PC-MRI acquisition. In the updated protocol, the user will specify the number and relative displacements of HS with respect to SOI. Upon the completion of SOI localization, the scanner will automatically move the table and perform low-resolution, free-breathing scans, one for each HS. Based on the contents of HS, e.g., the extent and location of static tissue, the user will specify which HS would be collected along with SOI. Each HS will be scanned using exactly the same scan parameters and gradient waveforms as the SOI; e.g., if the SOI is acquired as a segmented k-space acquisition during breath-hold, then each HS will be acquired in identical fashion. Upon the completion of multi-slice acquisition, the joint processing of the data as outlined in Task 1 will be performed on the scanner. The acquisition protocol for the mSAP method of the present disclosure will add less than 5 seconds to the overall data processing time.

Thus, the above demonstrates of performance of multi-slice acquisition and processing on the scanner. By streamlining the workflow, the overhead of performing multi-slice acquisition will be minimized.

Preliminary Data (Phantom Studies)

Figure 4:
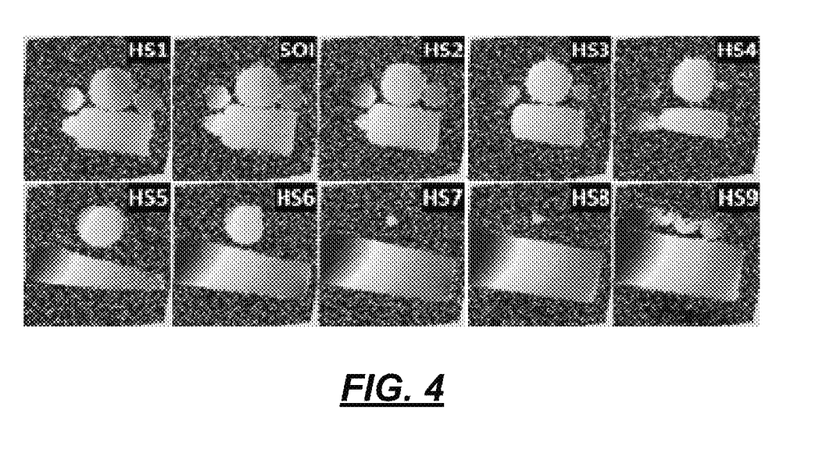
FIG. 4 illustrates example time-averaged phase maps from ten different slices.

This study was performed to determine whether the information from HS can be used to correct the BP in SOI if all the acquisitions are performed using the same gradient waveforms. A CardioFlow 5000 MR flow pump was used to generate pulsatile flow. The pump was connected to a flexible pipe that was bent into a u-shape such that two sections of the pipe were aligned in parallel inside the magnet. The imaging plane orientation was selected such that in-flow and return-flow were measured simultaneously. To mimic in vivo static tissue, a total of 9 water bottles of various sizes were placed around the pipe. Ten parallel slices were imaged, each at the isocenter of the magnet by changing the table position. The distance between adjacent slices was fixed at 2 cm. The phase maps from those ten slices are shown in FIG. 4, which illustrates time-averaged phase maps (after applying the correction for concomitant gradients) from 10 different slices. The display range is ±5% of the VENC. One slice is designated as SOI (top row, second from the left); other nine slices are designated as HS. Strong EC-BP is visible in all slices. The imaging parameters were: scanner: 3T (Siemens Trio), FOV: 400×400 mm$^2$, matrix size: 256×256, TE/TR: 2.4/4.8 ms, coil array: 18 element body coil, acceleration: 2, reconstruction: TGRAPPA, slice thickness: 6 mm, VENC: 100 cm/s.

Figure 5:
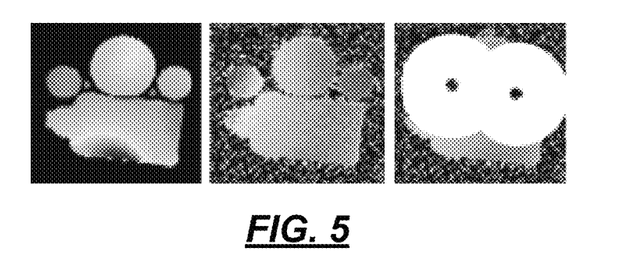
FIG. 5 illustrates an enlarged view of SOI shown in FIG. 4.

One of the ten slices in FIG. 4 was designated as the SOI because the pipes in this slice were in close proximity to the static fluid bottles. This allows use of the traditional method (Eq. 1) with a $5^{th}$ order polynomial to obtain a stable estimate of BP. The BP estimated using this method was treated as the ground truth. To fabricate the absence of static tissue in the SOI, the signal from the static fluid in close proximity to the pipes was disregarded, i.e., pixels near the two pipe cross-sections were not included in the fitting process. This is referred to as a handicapped version as SOI* and shown in FIG. 5, which illustrates an enlarged view of SOI shown in FIG. 4. In FIG. 5, the left image is a time-averaged magnitude image, the middle images is time-averaged phase image (SOI), and right image is a time-averaged phase image with the area that was excluded from the fitting displayed in white (SOI*). The locations of pipe carrying the pulsatile flow are highlighted with white arrows in the magnitude image.). SOI* was also fitted with the traditional method (Eq. 1) but only with a $1^{st}$ order polynomial; higher order fitting of SOI* (not shown) yielded worse results.

As shown in Table 1, background correction in SOI* is ineffective, as evident by 16.9% discrepancy in stroke volume compare to SOI. To test mSAP, we jointly processed SOI* and HS (Eq. 3). The process was repeated individually for all HS. In this preliminary work, the covariance matrix, $\Omega$, was approximated by a diagonal matrix with entries indicating the temporal variance at each pixel. As evident from Table 1, all HS slices, when included individually, improved the flow quantification in SOI*, which affirms the key assumption made for mSAP: all slices collected under the same gradient waveforms but with different table positions have the same (or very similar) background phase. By employing information from a single HS, the error in the computation of stroke volume was reduced to 2.62% or less. Inclusion of more than one slice did not change the results significantly (data not shown), implying that the information from one HS may be adequate to suppress EC-BP.

TABLE 1

Stroke volume (mL) in the two legs of the pipe (+ve for in-flow and −ve for return-flow).

| Data used for fitting | Stroke Volume (% error) | | Correction method |
|---|---|---|---|
| SOI | 34.3 | −34.4 | Ground truth |
| SOI* | 33.1 (3.50%) | −40.2 (16.9%) | Traditional |
| SOI* + HS1 | 34.2 (0.29%) | −33.9 (1.45%) | mSAP |
| SOI* + HS2 | 34.3 (0.00%) | −34.6 (0.58%) | mSAP |
| SOI* + HS3 | 34.4 (0.29%) | −34.6 (0.58%) | mSAP |
| SOI* + HS4 | 34.5 (0.58%) | −34.7 (0.87%) | mSAP |
| SOI* + HS5 | 34.2 (0.29%) | −34.0 (1.16%) | mSAP |
| SOI* + HS6 | 34.5 (0.58%) | −34.8 (1.16%) | mSAP |
| SOI* + HS7 | 34.7 (1.17%) | −33.9 (1.45%) | mSAP |
| SOI* + HS8 | 34.9 (1.75%) | −33.5 (2.62%) | mSAP |
| SOI* + HS9 | 34.6 (0.87%) | −33.9 (1.45%) | mSAP |

SOI indicates when the entire slice was used for fitting (ground truth), SOI* indicates when the static signal proximal to the pipes was removed to mimic cardiac imaging, SOI* + HSn indicates when the data from SOI* and HSn was jointly processed, where $1 \le n \le 9$ identifies the specific HS used in fitting.

Preliminary Data (Volunteer Imaging)

Figure 6:
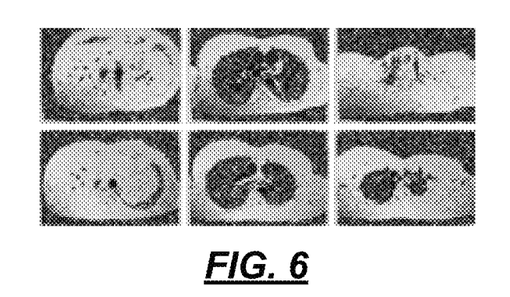
FIG. 6 illustrates an example time-averaged phase map from two different views.

A human volunteer was imaged on a 3T (Siemens Skyra) system, equipped with 18-channel coil array. Other imaging parameters were: FOV: 380×260 mm$^2$, matrix size: 192× 132, TE/TR: 2.94/5.0 ms, acceleration: 2, reconstruction: TGRAPPA, slice thickness: 6 mm, VENC: 100 or 150 cm/s depending on the view. The acquisition was performed using two different views to measure the flow (Qp) in MPA and the flow (Qs) in AA. With reference to FIG. 6, which illustrates time-averaged phase map from two different views, for each view, three slices were collected: one SOI and two HS. Three slices (SOI and two HS) were collected for each view.). The HS were placed on either side of the SOI at the displacement of 120 to 150 mm. mSAP ($5^{th}$ order) was applied to correct BP separately for each view; the resulting Qp/Qs ratios are listed in Table 2. The consistency of the BP information across SOI and HS—an underlying assumption for mSAP—is evident from the invariability in the estimated Qp/Qs values when one HS is swapped with the other.

TABLE 2

BP correction based on different combinations of slices; the resulting Qp/Qs are reported.

| Data used for fitting | Qp/Qs | Correction method |
|---|---|---|
| uncorrected | 1.112 | None |
| MPA: SOI + HS1<br>AA: SOI + HS1 | 1.054 | mSAP |
| MPA: SOI + HS1<br>AA: SOI + HS2 | 1.046 | mSAP |
| MPA: SOI + HS2<br>AA: SOI + HS1 | 1.061 | mSAP |
| MPA: SOI + HS2<br>AA: SOI + HS2 | 1.053 | mSAP |

Outcome mSAP adequately corrects the background phase, with the acquisition of only a single helper slice, and the inclusion of additional HS to result in only marginal additional improvement. The BP errors are below 0.4% of the dynamic range and the resulting miscalculation in flow volume to be below 5%.

In the above, the gradient waveforms used to acquire SOI and HS may differ due to heart rate variations. The transitory effects of incrementing the phase encoding gradient with each R-wave, however, should be negligible. If this is not the case, it will be possible to record the triggering waveform from the SOI scan and use it to collect HS data.

Although the covariance matrix used in mSAP is built from the spatiotemporal phase series, the fitting processing itself is applied to the time-averaged phase map. There may be small temporal fluctuations in BP across the cardiac cycle. If BP varies temporally—as observed by the disparity in fitting accuracy across different frames—the individual frames may be re-fitted by using the fitting obtained from time-averaged data as a prior, thereby allowing the BP of individual frames to vary slightly from the time-averaged value.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

BIBLIOGRAPHY

1. Weiss, M. B. et al. Myocardial blood flow in congestive and hypertrophic cardiomyopathy: relationship to peak wall stress and mean velocity of circumferential fiber shortening. *Circulation* 54, 484-494 (1976).
2. Clark, D. M., Plumb, V. J., Epstein, A. E. & Kay, G. N. Hemodynamic effects of an irregular sequence of ventricular cycle lengths during atrial fibrillation. *J. Am. Coll. Cardiol.* 30, 1039-1045 (1997).
3. Aurigemma, G. et al. Abnormal left ventricular intracavitary flow acceleration in patients undergoing aortic valve replacement for aortic stenosis. A marker for high postoperative morbidity and mortality. *Circulation* 86, 926-936 (1992).
4. Taylor, T. W. & Yamaguchi, T. Three-dimensional simulation of blood flow in an abdominal aortic aneurysm—steady and unsteady flow cases. *J. Biomech. Eng.* 116, 89-97 (1994).
5. Powell, A. J. & Geva, T. Blood flow measurement by magnetic resonance imaging in congenital heart disease. *Pediatr. Cardiol.* 21, 47-58 (2000).
6. Galderisi, M. et al. Recommendations of the European Association of Echocardiography How to use echo-Doppler in clinical trials: Different modalities for different purposes. *Eur. J. Echocardiogr.* 12, 339-353 (2011).
7. Moran, P. R. A flow velocity zeugmatographic interlace for NMR imaging in humans. *Magn. Reson. Imaging* 1, 197-203 (1982).
8. Pelc, N. J., Herfkens, R. J., Shimakawa, A. & Enzmann, D. R. Phase contrast cine magnetic resonance imaging. *Magn. Reson. Q.* 7, 229-254 (1991).
9. Gatehouse, P. D. et al. Flow measurement by cardiovascular magnetic resonance: a multi-centre multi-vendor study of background phase offset errors that can compromise the accuracy of derived regurgitant or shunt flow measurements. *J. Cardiovasc. Magn. Reson.* 12, 5 (2010).
10. Kilner, P. J., Gatehouse, P. D. & Firmin, D. N. Flow measurement by magnetic resonance: a unique asset worth optimising. *J. Cardiovasc. Magn. Reson.* 9, 723-728 (2007).
11. Lorenz, R. et al. Influence of eddy current, Maxwell and gradient field corrections on 3D flow visualization of 3D CINE PC-MRI data. *Magn. Reson. Med.* 72, 33-40 (2014).
12. Bernstein, M. A. et al. Concomitant gradient terms in phase contrast MR: Analysis and correction. *Magn. Reson. Med.* 39, 300-308 (1998).
13. Chernobelsky, A., Shubayev, O., Comeau, C. R. & Wolff, S. D. Baseline correction of phase contrast images improves quantification of blood flow in the great vessels. *J. Cardiovasc. Magn. Reson.* 9, 681-685 (2007).
14. Lankhaar, J. W. et al. Correction of phase offset errors in main pulmonary artery flow quantification. *J. Magn. Reson. Imaging* 22, 73-79 (2005).
15. Holland, B. J., Printz, B. F. & Lai, W. W. Baseline correction of phase-contrast images in congenital cardiovascular magnetic resonance. *J. Cardiovasc. Magn. Reson.* 12, 11 (2010).
16. Gatehouse, P. D. et al. A multi-center inter-manufacturer study of the temporal stability of phase-contrast velocity mapping background offset errors. *J. Cardiovasc. Magn. Reson.* 14, 72 (2012).
17. Noureldin, R. A. et al. The diagnosis of hypertrophic cardiomyopathy by cardiovascular magnetic resonance. *J. Cardiovasc. Magn. Reson.* 14, 17 (2012).
18. Fluckiger, J. U. et al. Left atrial flow velocity distribution and flow coherence using four-dimensional FLOW MRI: A pilot study investigating the impact of age and Pre- and Postintervention atrial fibrillation on atrial hemodynamics. *J. Magn. Reson. Imaging* 38, 580-587 (2013).
19. Mitchell, L., Jenkins, J. P., Watson, Y., Rowlands, D. J. & Isherwood, I. Diagnosis and assessment of mitral and aortic valve disease by cine-flow magnetic resonance imaging. *Magn. Reson. Med.* 12, 181-197 (1989).
20. Harloff, A. et al. In vivo assessment of wall shear stress in the atherosclerotic aorta using flow-sensitive 4D MRI. *Magn. Reson. Med.* 63, 1529-1536 (2010).
21. Moore, J. E., Xu, C., Glagov, S., Zarins, C. K. & Ku, D. N. Fluid wall shear stress measurements in a model of the human abdominal aorta: Oscillatory behavior and relationship to atherosclerosis. *Atherosclerosis* 110, 225-240 (1994).
22. Hope, T. A. et al. Comparison of flow patterns in ascending aortic aneurysms and volunteers using four- 23. Reeder, G. S., Currie, P. J., Hagler, D. J., Tajik, A. J. & Seward, J. B. Use of Doppler Techniques (Continuous-Wave, Pulsed-Wave, and Color Flow Imaging) in the Noninvasive Hemodynamic Assessment of Congenital Heart Disease. *Mayo Clin. Proc.* 61, 725-744 (1986).

24. François, C. J. et al. Renal arteries: isotropic, high-spatial-resolution, unenhanced MR angiography with three-dimensional radial phase contrast. *Radiology* 258, 254-260 (2011).

25. Stankovic, Z. et al. Normal and Altered Three-dimensional Portal Venous Hemodynamics in Patients with Liver Cirrhosis. *Radiology* 262, 862-873 (2012).

26. Hope, T. A. et al. Evaluation of intracranial stenoses and aneurysms with accelerated 4D flow. *Magn. Reson. Imaging* 28, 41-46 (2010).

27. Arenillas, J. F. et al. Progression and clinical recurrence of symptomatic middle cerebral artery stenosis: a long-term follow-up transcranial Doppler ultrasound study. *Stroke.* 32, 2898-2904 (2001).

28. Strandness, D. E., Schultz, R. D., Sumner, D. S. & Rushmer, R. F. Ultrasonic flow detection. *Am. J. Surg.* 113, 311-320 (1967).

29. Nordmeyer, S. et al. Four-dimensional velocity-encoded magnetic resonance imaging improves blood flow quantification in patients with complex accelerated flow. *J. Magn. Reson. Imaging* 37, 208-216 (2013).

30. Schubert, T., Bieri, O., Pansini, M., Stippich, C. & Santini, F. Peak velocity measurements in tortuous arteries with phase contrast magnetic resonance imaging: the effect of multidirectional velocity encoding. *Invest. Radiol.* 49, 189-194 (2014).

31. Gatehouse, P. D. et al. Applications of phase-contrast flow and velocity imaging in cardiovascular MRI. *Eur. Radiol.* 15, 2172-2184 (2005).

32. Frydrychowicz, A. et al. Three-dimensional analysis of segmental wall shear stress in the aorta by flow-sensitive four-dimensional-MRI. *J. Magn. Reson. Imaging* 30, 77-84 (2009).

33. Markl, M. et al. Estimation of global aortic pulse wave velocity by flow-sensitive 4D MRI. *Magn. Reson. Med.* 63, 1575-1582 (2010).

34. Dyverfeldt, P., Hope, M. D., Tseng, E. E. & Saloner, D. Magnetic resonance measurement of turbulent kinetic energy for the estimation of irreversible pressure loss in aortic stenosis. *JACC Cardiovasc. Imaging* 6, 64-71 (2013).

35. Tyszka, J. M., Laidlaw, D. H., Asa, J. W. & Silverman, J. M. Three-dimensional, time-resolved (4D) relative pressure mapping using magnetic resonance imaging. *J. Magn. Reson. Imaging* 12, 321-329 (2000).

36. Ebbers, T. et al. Higher order weighted least-squares phase offset correction for improved accuracy in phase-contrast MRI. in *ISMRM 16th Annu. Meet. Exhib.* 1367 (2008).

37. Eriksson, J. et al. Semi-automatic quantification of 4D left ventricular blood flow. *J. Cardiovasc. Magn. Reson.* 12, 9 (2010).

38. Hsiao, A. et al. Rapid pediatric cardiac assessment of flow and ventricular volume with compressed sensing parallel imaging volumetric cine phase-contrast MRI. *Am. J. Roentgenol.* 198, (2012).

39. Fair, M., Gatehouse, P. D., Greiser, A., Drivas, P. & Firmin, D. N. A novel approach to phase-contrast velocity offset correction by in vivo high-SNR acquisitions. *J. Cardiovasc. Magn. Reson.* 15, P56 (2013).

40. Lustig, M., Donoho, D. L., Santos, J. M. & Pauly, J. M. Compressed Sensing MRI. *IEEE Signal Process. Mag.* 25, 72-82 (2008).

41. Griswold, M. A. et al. Generalized autocalibrating partially parallel acquisitions (GRAPPA). *Magn. Reson. Med.* 47, 1202-1210 (2002).

42. Pruessmann, K. P., Weiger, M., Scheidegger, M. B. & Boesiger, P. SENSE: Sensitivity encoding for fast MRI. *Magn. Reson. Med.* 42, 952-962 (1999).

43. Markl, M. et al. Generalized reconstruction of phase contrast MRI: Analysis and correction of the effect of gradient field distortions. *Magn. Reson. Med.* 50, 791-801 (2003).

44. Beck, A. & Teboulle, M. A Fast Iterative Shrinkage-Thresholding Algorithm for Linear Inverse Problems. *SIAM J. Imaging Sci.* 2, 183-202 (2009).

45. Chen, W., Guo, Y., Wu, Z. & Nayak, K. MRI Constrained Reconstruction Without Tuning Parameters Using ADMM and Morozov's Discrepency Principle. in *ISMRM 23rd Annu. Meet. Exhib.* 3410 (2015).

46. Hansen, P. C. & O'Leary, D. P. The Use of the L-Curve in the Regularization of Discrete Ill-Posed Problems. *SIAM J. Sci. Comput.* 14, 1487-1503 (1993).

47. Tan, E. T., Brau, A. C. & Hardy, C. J. Nonlinear self-calibrated phase-contrast correction in quantitative cardiac imaging. *J. Cardiovasc. Magn. Reson.* 16, P349 (2014).

48. Iglewicz, B. & Hoaglin, D. *How to detect and handle outliers.* (ASQC Quality Press, 1993).

49. Breuer, F. A., Kellman, P., Griswold, M. A. & Jakob, P. M. Dynamic autocalibrated parallel imaging using temporal GRAPPA (TGRAPPA). *Magn. Reson. Med.* 53, 981-985 (2005).

50. Bernstein, M. A., Grgic, M., Brosnan, T. J. & Pelc, N. J. Reconstructions of phase contrast, phased array multicoil data. *Magn. Reson. Med.* 32, 330-334 (1994).

51. Dunn, O. J. Multiple Comparisons Using Rank Sums. *Technometrics* 6, pp. 241-252 (1964).

What is claimed:

1. A method of correcting eddy currents-induced background phase (EC-BP) in magnetic resonance imaging data, comprising:

acquiring phase-contrast data from a slice of interest (SOI) using a magnetic resonance imaging (MRI) scanner, with a user-specified table position and SOI position and orientation; the SOI position and orientation, with respect to the magnet coordinate system, being controlled by varying a center frequency of an applied radio-frequency (RF) excitation pulse in combination with a variation of a slice select gradient amplitude and direction;

acquiring phase-contrast data from at least one additional slice, the at least one additional slice having the same position and orientation, with respect to the magnet coordinate system, as the SOI and being acquired using the slice select gradient amplitude and direction, the at least one additional slice imaging a physically different location of the subject, achieved by either changing the table position with respect to the position used for the SOI acquisition or by physically moving the subject within the scanner;

performing image reconstruction from k-space to image domain for the SOI and the at least one additional slice;

subtracting a phase of a reconstructed additional slice from a phase of a reconstructed SOI to extract phase difference maps for the SOI and the at least one additional slice;

determining a correction map by:
processing the phase difference maps from both the SOI and the at least one additional slice; and
estimating EC-BP in accordance with a first relationship:

$$\hat{x}_{mSAP} = \underset{x}{\mathrm{argmin}} \|Bx - z\|_\Omega^2,$$

wherein $x \in \mathbb{R}^{k \times 1}$ represents the k coefficients of a 2D polynomial, wherein B and z are obtained by vertical concatenation of N temporally-averaged slices, such that $B \triangleq [A_1^T|A_2^T| \ldots |A_N^T]^T$ and $z \triangleq [y_1^T|y_2^T| \ldots |y_N^T]^T$, and $\|Bx-z\|_\Omega^2 \triangleq (Bx-z)'\Omega^{-1}(Bx-z)$, wherein each column of matrix $A \in \mathbb{R}^{M \times k}$ defines the spatial distribution of one of the polynomial terms, wherein vector $y \in \mathbb{R}^{M \times 1}$ is the measured temporally-averaged phase map, wherein $\Omega \in \mathbb{R}^{NM \times NM}$ is a covariance matrix constructed by computing inner products of mean-subtracted temporal profiles across all pixel pairs in z; and correcting the BP of the SOI using the correction map.

2. The method of claim 1, wherein volumetric field of view is used instead of 2D slices.

3. The method of claim 1, wherein multiple encoding directions are used and correction is applied to each encoding direction.

4. The method of claim 1, wherein the background arises from sources other than eddy currents.

5. The method of claim 1, further enforcing an $l_1$-norm penalty on polynomial coefficients to transform the first relationship as follows:

$$\hat{x}_{mSAP} = \underset{x}{\mathrm{argmin}} \|Bx - z\|_\Omega^2 + \lambda.$$

6. The method of claim 5, wherein $\|x\|_1$ is replaced with $\|Rx\|_p$ with $p \geq 0$ and R is a linear or nonlinear transform.

7. The method of claim 1, further comprising applying a Cholesky decomposition, $\Omega = LL'$, $\tilde{B} \triangleq L^{-1}B$, $\tilde{z} \triangleq L^{-1}z$, and enforcing an $l_1$-norm penalty on polynomial coefficients yielding:

$$\hat{x}_{mSAP} = \underset{x}{\mathrm{argmin}} \|\tilde{B}x - \tilde{z}\|_2^2 + \lambda.$$

8. The method of claim 7, wherein $\|x\|_1$ is replaced with $\|Rx\|_p$ with $p \geq 0$ and R is a linear or nonlinear transform.

9. The method of claim 1, wherein a correction map, $\hat{\phi}_{mSAP}$, is then obtained by $\hat{\phi}_{mSAP} = A_i \hat{x}_{mSAP}$, wherein A corresponds to the SOI.

10. The method of claim 1, wherein only one slice (SOI) is collected and processed to find the correction map.

11. The method of claim 1, wherein only additional slices are used to find the correction map for SOI.

12. The method of claim 1, wherein the data from individual frames, before time-averaging, is used to construct B, z, $\tilde{B}$, and $\tilde{z}$.

13. The method of claim 1, wherein polynomials of different orders are used.

14. The method is claim 1, wherein functions other than polynomial functions are used for fitting the background phase.

15. The method of claim 1, further comprising constructing $\Omega$ in a sparse format by setting entries with small values equal to zero.

16. The method of claim 1, further approximating $\Omega$ by setting all off-diagonal entries to zero.

17. The method of claim 1, replacing $\Omega$ with the identity matrix and only considering the pixels in z which have small temporal standard deviation.

18. The method of claim 1, further comprising removing rows from B and z that belong to a region with nearly zero spin-density.

19. The method of claim 1, wherein a solution to one of a first relationship, a second relationship or a third relationship, respectively below is used as prior information for removal of concomitant gradients and gradient non-linearity:

$$\hat{x}_{mSAP} = \underset{x}{\mathrm{argmin}} \|Bx - z\|_\Omega^2 \text{ or}$$

$$\hat{x}_{mSAP} = \underset{x}{\mathrm{argmin}} \|Bx - z\|_\Omega^2 + \lambda \text{ or}$$

$$\hat{x}_{mSAP} = \underset{x}{\mathrm{argmin}} \|\tilde{B}x - \tilde{z}\|_2^2 + \lambda$$

wherein $x \in \mathbb{R}^{k \times 1}$ represents the k coefficients of a 2D polynomial, wherein B and z are obtained by vertical concatenation of N temporally-averaged slices, such that $B \triangleq PI [A_1^T|A_2^T| \ldots |A_N^T]T$ and $z \triangleq [y_1^T|y_2^T| \ldots |y_N^T]^T$, and $\|Bx-z\|_\Omega^2 \triangleq (Bx-z)'\Omega^{-1}(Bx-z)$, wherein each column of matrix $A \in \mathbb{R}^{M \times k}$ defines the spatial distribution of one of the polynomial tennis, wherein vector $y \in \mathbb{R}^{M \times 1}$ is the measured temporally-averaged phase map, wherein $\Omega \in \mathbb{R}^{NM \times NM}$ is a covariance matrix constructed by computing inner products of mean-subtracted temporal profiles across all pixel pairs in z, wherein enforcing an $l_1$-norm penalty on polynomial coefficients transforms the first relationship to the second relationship, and wherein a Cholesky decomposition, $\Omega = LL'$, $\tilde{B} \triangleq L^{-1}B$, $\tilde{z} \triangleq L^{-1}z$, is applied to the second relationship to yield the third relationship.

* * * * *

UNITED STATES PATENT AND TRADEMARK OFFICE
CERTIFICATE OF CORRECTION

PATENT NO. : 9,911,062 B1
APPLICATION NO. : 14/918184
DATED : March 6, 2018
INVENTOR(S) : Rizwan Ahmad et al.

It is certified that error appears in the above-identified patent and that said Letters Patent is hereby corrected as shown below:

In the Specification

Column 1, starting at Line 4, add the following new paragraph, before the BACKGROUND paragraph:
--STATEMENT OF GOVERNMENT SUPPORT
This invention was made with government support under R01 HL102450 awarded by the National Institutes of Health. The government has certain rights in the invention.--

Signed and Sealed this
Twenty-third Day of October, 2018

Andrei Iancu
*Director of the United States Patent and Trademark Office*

UNITED STATES PATENT AND TRADEMARK OFFICE
CERTIFICATE OF CORRECTION

PATENT NO. : 9,911,062 B1
APPLICATION NO. : 14/918184
DATED : March 6, 2018
INVENTOR(S) : Rizwan Ahmad, Ning Jin and Orlando P. Simonetti Page 1 of 1

It is certified that error appears in the above-identified patent and that said Letters Patent is hereby corrected as shown below:

In the Specification

Column 1, Line 3 add the following Government Support Clause:
--This invention was made with government support under R01 HL102450 awarded by National Institutes of Health. The government has certain rights in the invention.--

This certificate supersedes the Certificate of Correction issued October 18, 2018.

Signed and Sealed this
Eighteenth Day of August, 2020

Andrei Iancu
*Director of the United States Patent and Trademark Office*